US012642083B2

(12) United States Patent
Chung et al.

(10) Patent No.: US 12,642,083 B2
(45) Date of Patent: May 26, 2026

(54) SEMICONDUCTOR DEVICE INCLUDING BACKSIDE CONTACT STRUCTURE FORMED BASED ON WIDE PLACEHOLDER STRUCTURE

(71) Applicant: SAMSUNG ELECTRONICS CO., LTD., Suwon-si (KR)

(72) Inventors: Wonkeun Chung, Clifton Park, NY (US); Byounghoon Kim, Rexford, NY (US); Jongjin Lee, Clifton Park, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/887,789

(22) Filed: Sep. 17, 2024

(65) Prior Publication Data

US 2025/0316594 A1 Oct. 9, 2025

Related U.S. Application Data

(60) Provisional application No. 63/631,749, filed on Apr. 9, 2024.

(51) Int. Cl.

| | |
|---|---|
| ***H10W 20/41*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC ........ *H10W 20/435* (2026.01); *H10D 30/014* (2025.01); *H10D 30/43* (2025.01); *H10D 30/6735* (2025.01); *H10D 30/6757* (2025.01); *H10D 62/121* (2025.01); *H10D 62/151* (2025.01); *H10D 84/017* (2025.01); *H10D 84/0186* (2025.01); *H10D 84/038* (2025.01); *H10D 84/85* (2025.01)

(58) Field of Classification Search

CPC ......... H01L 23/5283; H01L 21/823814; H01L 21/823871; H01L 27/092; H01L 29/0673; H01L 29/0847; H01L 29/42392; H01L 29/66439; H01L 29/775; H01L 29/78696

See application file for complete search history.

(56) References Cited

U.S. PATENT DOCUMENTS

| | | | | |
|---|---|---|---|---|
| 11,393,929 | B2 * | 7/2022 | Yang | B82Y 10/00 |
| 2018/0294331 | A1 * | 10/2018 | Cho | H10D 62/102 |

(Continued)

OTHER PUBLICATIONS ip.com search attached (Year: 2026).*

Extended European Search Report corresponding to EP Application No. 25167723.3 (mailed Oct. 21, 2025).

*Primary Examiner* — Brent A. Fairbanks
*Assistant Examiner* — Andre C Stevenson
(74) *Attorney, Agent, or Firm* — Myers Bigel, P.A.

(57) ABSTRACT

Provided is a semiconductor device including a backside contact structure formed based on a placeholder structure having a wide profile, an a method of manufacturing the same. The method may include: forming a source/drain region; and forming a backside contact structure on a bottom surface of the source/drain region such that a width of an upper portion of the backside contact structure is greater than a width of the source/drain region in a channel-length direction.

18 Claims, 21 Drawing Sheets

(51) Int. Cl.

| | |
|---|---|
| ***H10D 62/13*** | (2025.01) |
| ***H10D 84/01*** | (2026.01) |
| ***H10D 84/03*** | (2025.01) |
| ***H10D 84/85*** | (2025.01) |

(56) References Cited

U.S. PATENT DOCUMENTS

| | | | | |
|---|---|---|---|---|
| 2021/0217749 | A1* | 7/2021 | Lee | H10D 84/038 |
| 2022/0139911 | A1* | 5/2022 | Wei | H01L 23/5226 257/365 |
| 2023/0268389 | A1 | 8/2023 | Jain et al. | |
| 2023/0343699 | A1* | 10/2023 | Lu | H10D 30/43 |
| 2024/0038842 | A1* | 2/2024 | Chun | H10D 30/43 |
| 2024/0072134 | A1 | 2/2024 | Xie et al. | |
| 2024/0088038 | A1 | 3/2024 | Xie et al. | |
| 2024/0096951 | A1 | 3/2024 | Mukesh et al. | |
| 2024/0105768 | A1 | 3/2024 | Xie et al. | |
| 2024/0105788 | A1 | 3/2024 | Xie et al. | |
| 2024/0105799 | A1 | 3/2024 | Xie et al. | |
| 2024/0113193 | A1 | 4/2024 | Li et al. | |
| 2024/0429097 | A1* | 12/2024 | Li | H10D 62/121 |
| 2025/0022957 | A1* | 1/2025 | Lin | H10D 62/151 |
| 2025/0294847 | A1* | 9/2025 | Johnson | H10D 64/01 |

* cited by examiner

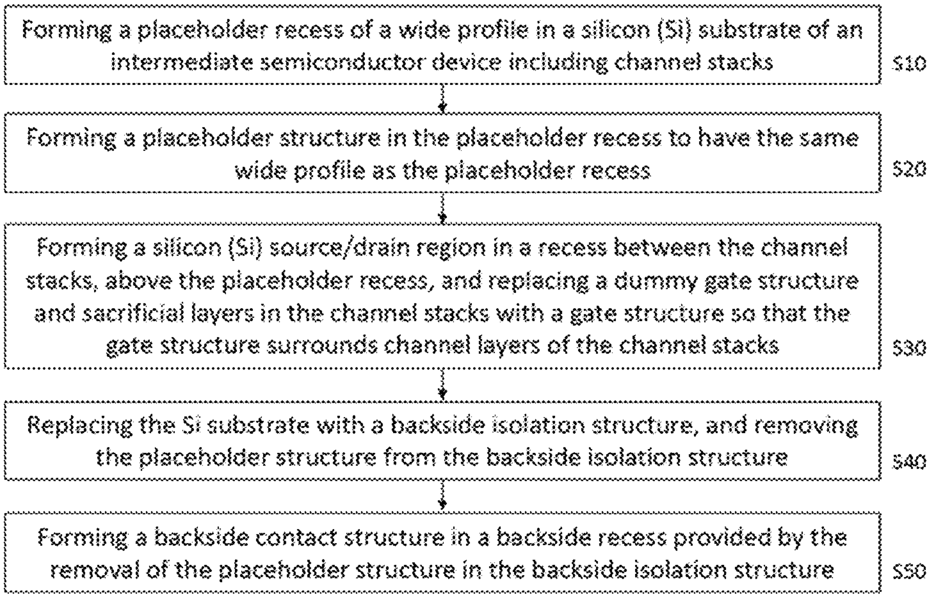

FIG. 4

| | |
|---|---|
| Forming a placeholder recess of a wide profile in a silicon (Si) substrate of an intermediate semiconductor device including channel stacks | S10 |
| Forming a placeholder structure in the placeholder recess to have the same wide profile as the placeholder recess | S20 |
| Forming a silicon (Si) source/drain region in a recess between the channel stacks, above the placeholder recess, and replacing a dummy gate structure and sacrificial layers in the channel stacks with a gate structure so that the gate structure surrounds channel layers of the channel stacks | S30 |
| Replacing the Si substrate with a backside isolation structure, and removing the placeholder structure from the backside isolation structure | S40 |
| Forming a backside contact structure in a backside recess provided by the removal of the placeholder structure in the backside isolation structure | S50 |

SEMICONDUCTOR DEVICE INCLUDING BACKSIDE CONTACT STRUCTURE FORMED BASED ON WIDE PLACEHOLDER STRUCTURE

CROSS-REFERENCE TO RELATED APPLICATION

This application is based on and claims priority to U.S. Provisional Application No. 63/631,749 filed on Apr. 9, 2024 in the U.S. Patent and Trademark Office, the disclosure of which is incorporated herein in its entirety by reference.

BACKGROUND

1. Field

Apparatuses and methods consistent with example embodiments of the disclosure relate to a semiconductor device including a backside contact structure.

2. Description of Related Art

Growing demand for an integrated circuit having a high device density and performance has introduced a field-effect transistor such as fin field-effect transistor (FinFET), a nanosheet transistor, a forksheet transistor, or many other types of field-effect transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, multi-bridge channel field-effect transistor (MBCFET). The forksheet transistor takes a form of a combination of two nanosheet transistors with an isolation wall therebetween as an insulation backbone. Nanosheet channel layers of each nanosheet transistor in the forksheet transistor may be formed at each side of the isolation wall and pass through a gate structure of the nanosheet transistor at each side of the isolation wall.

Further, a backside power distribution network (BSPDN) structure formed at a back side of a field-effect transistor structure has been introduced to address a routing complexity and excessive IR drop at a front side of the field-effect transistor structure, thereby to achieve high power delivery performance, and further, to scale down a standard cell height. The BSPDN structure may include a backside metal line and/or a backside contact structure (or backside contact plug) through which a positive or negative voltage may be supplied to a source/drain region of the field-effect transistor. The backside contact structure may also be used to connect the source/drain region of the field-effect transistor to another circuit element. Among various proposed schemes, a direct backside contact (DBC) structure formed on a bottom surface of a source/drain region is known as the most efficient and the highest-performance contact structure.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides a semiconductor device including a backside contact structure formed by replacing a placeholder structure having a wide profile in a backside isolation structure, and a method of manufacturing the same. The placeholder structure may be formed to have the wide profile in a substrate so that an wet etchant removing the substrate may not attack a source/drain region formed on the placeholder structure in a backside process for the semiconductor device. Thus, the wide-profile placeholder structure may prevent loss of the source/drain region in the backside process, and the backside contact structure also having the wide-profile may provide an improved connection performance with reduced contact resistance.

Although a backside contact structure for an n-type source/drain region of a semiconductor device may have a wide profile, a placeholder structure and a backside contact structure for a p-type source/drain region may not need to have the wide profile due to the material forming the p-type source/drain region.

According to an aspect of the disclosure, there is provided a semiconductor device which may include: a source/drain region; and a backside contact structure on a bottom surface of the source/drain region, wherein a width of an upper portion of the backside contact structure is greater than a width of the source/drain region in a channel-length direction.

According to an aspect of the disclosure, there is provided a semiconductor device which may include: a semiconductor device including a $1^{st}$ transistor and a $2^{nd}$ transistor, wherein the $1^{st}$ transistor includes a $1^{st}$ source/drain region; and a $1^{st}$ backside contact structure on a bottom surface of the $1^{st}$ source/drain region, wherein a width of an upper portion of the $1^{st}$ backside contact structure is greater than a width of the 1st source/drain region in a channel-length direction, wherein the $2^{nd}$ transistor includes a $2^{nd}$ source/drain region; and a $2^{nd}$ backside contact structure on a bottom surface of the $2^{nd}$ source/drain region, and wherein an upper portion of the $2^{nd}$ backside contact structure has a smaller width than an upper portion of the $1^{st}$ backside contact structure.

According to an aspect of the disclosure, there is provided a method of manufacturing a semiconductor device. The method may include: forming a source/drain region; and forming a backside contact structure on a bottom surface of the source/drain region such that a width of an upper portion of the backside contact structure is greater than a width of the source/drain region in a channel-length direction.

BRIEF DESCRIPTION OF DRAWINGS

Example embodiments of the disclosure will be more clearly understood from the following detailed description taken in conjunction with the accompanying drawings in which:

FIG. 4 illustrates a flowchart describing a method of manufacturing a semiconductor device including a backside contact structure formed based on a placeholder structure having a wide profile in reference to FIGS. 2A-2P, according to one or more embodiments.

DETAILED DESCRIPTION

Figure 1A:
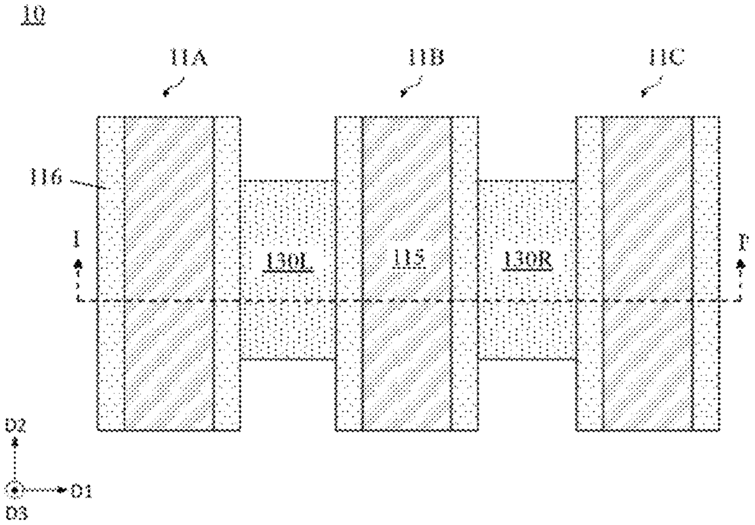
FIGS. 1A and 1B illustrate an intermediate semiconductor device including a placeholder structure to be replaced by a backside contact structure, according to one or more embodiments.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$" "$6^{th}$" etc. may be used herein to describe various elements, these elements should not be limited by these terms. These terms are only used to distinguish one element from another element. For example, a $1^{st}$ element described in descriptions of embodiments could be termed a $2^{nd}$ element in one set of claims and a $1^{st}$ element in another set of claims, without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension. Further, when a term "coplanar" or "aligned" is used to compare a positional relationship between two or more elements, the term may also cover "a substantially coplanar" or "substantially alighted" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity. Thus, it is to be understood that such schematic illustrations may not reflect actual images when any of the structures described herein are examined through scanning electron microscopy (SEM), transmission electron microscopy (TEM), focused ion beam (FIB) microscopy, etc.

For the sake of brevity, conventional elements, structures or layers of semiconductor devices including a nanosheet transistor, a fin field-effect transistor, and materials forming the same may or may not be described in detail herein. For example, a certain isolation layer, a buffer layer or a spacer structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments.

Figure 1B:
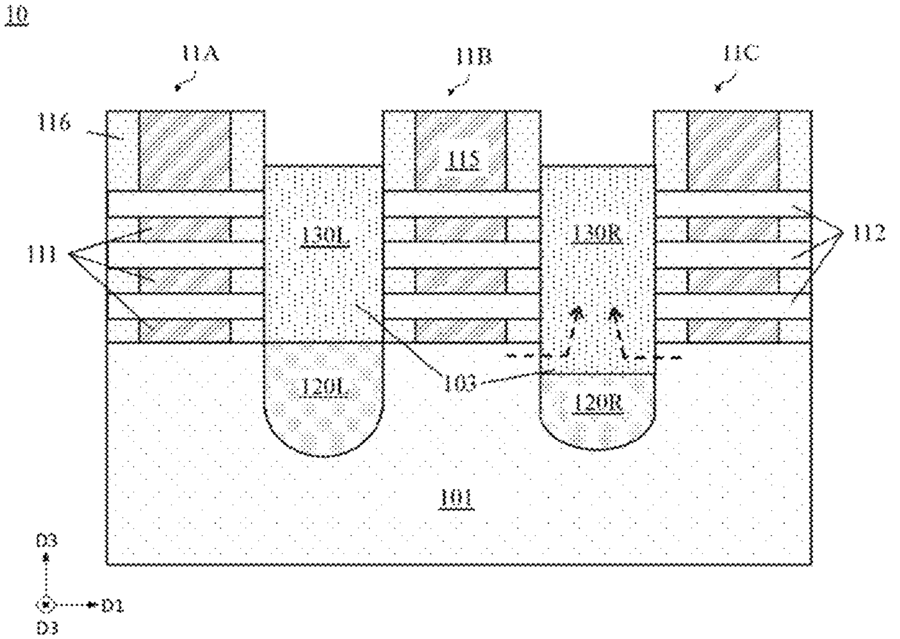

FIGS. 1A and 1B illustrate an intermediate semiconductor device including a placeholder structure to be replaced by a backside contact structure, according to one or more embodiments.

FIG. 1A is a simplified top plan view of an intermediate semiconductor device 10, and FIG. 1B illustrates a cross-section view of the intermediate semiconductor device 10 of FIG. 1A along a line I-I' shown therein in a D1 direction, according to one or more embodiments.

It is to be understood here that the intermediate semiconductor device 10 shown in FIGS. 1A and 1B is obtained prior to formation of structural elements such as contact structures and isolation structures included in a finished form of the intermediate semiconductor device 10. Thus, these structural elements are not shown in FIGS. 1A and 1B. It is to be further understood that the D1 direction is a channel-length direction intersecting a D2 direction, which is a channel-width direction or a cell-height direction, and a D3 direction is a vertical direction intersecting the D1 direction and the D2 direction. The channel-length direction refers to a direction in which a current flows between source/drain regions connection by a channel structure.

Referring to FIGS. 1A and 1B, the intermediate semiconductor device 10 may include $1^{st}$ to $3^{rd}$ channel stacks 11A-11C formed on a substrate 101. Each of the channel stacks 11A-11C may include a plurality of channel layers 112 vertically stacked on a front side of the intermediate semiconductor device 10 and surrounded by a gate structure 115. The channel layers 112 may have been epitaxially grown based on the substrate 101. Each of the channel layers 112 may be referred to as a nanosheet or nanoribbon extended in the D1 direction.

The channel layers 112 of each of the channel stacks 11A-11C surrounded by the gate structure 115 may form a channel structure which connects source/drain regions formed at both sides of each of the channel layers 112 to form a nanosheet transistor. For example, a nanosheet transistor may be formed by a channel structure including the channel layers 112, the gate structure 115 surrounding the channel structure, and a $1^{st}$ source/drain region 130L and a $2^{nd}$ source/drain region 130R connected by the channel layers 112 of the $2^{nd}$ channel stack 11B.

The substrate 101 may be a silicon (Si) substrate although it may include other materials such as silicon germanium (SiGe), silicon carbide (SiC), not being limited thereto. The channel layers 112 may be formed of a material such as silicon (Si), silicon germanium (SiGe), etc. The gate structure 115 may be formed of one or more materials including, for example, copper (Cu), aluminum (Al), cobalt (Co), tungsten (W), titanium (Ti), tantalum (Ta) or their combination. Each of the source/drain regions 130L and 130R may include one or more materials, for example, silicon (Si), silicon germanium (SiGe) doped with impurities. The source/drain regions 130L and 130R may be either p-type or n-type. When the source/drain regions 130L and 130R are formed of silicon (Si) doped with n-type impurities such as phosphorus (P), arsenic (As), antimony (Sb), etc., the intermediate semiconductor device 10 may form an n-type nanosheet transistor, and when the source/drain regions 130L and 130R are formed of silicon germanium (SiGe) doped with p-type impurities such as boron (B), gallium (Ga), indium (In), etc., the intermediate semiconductor device 10 may form a p-type nanosheet transistor.

Each of the channel stacks 11A-11C may also include inner spacers 131 formed at side surfaces of lower portions of the gate structure 115 respectively below the channel layers 112 in the D3 direction. Gate spacers 116 may be formed at side surfaces of an upper portion of the gate structure 115 in each of the channel stacks 11A-11C. The inner spacers 131 may isolate the lower portions of the gate structure 115 from the source/drain regions 130L and 130R, and the gate spacers 116 may isolate the upper portion of the gate structure 115 from the source/drain regions 130L and 130R. One or more materials forming the inner spacers 131 and the gate spacers 116 may include, for example, silicon nitride (e.g., SiN, $Si_3N_4$) or silicon oxide (e.g., $SiO_2$), not being limited thereto. The inner spacers 131 and the gate spacers 116 may be formed of the same or different materials.

The intermediate semiconductor device 10 may also include a $1^{st}$ placeholder structure 120L formed below the $1^{st}$ source/drain region 130L and a $2^{nd}$ placeholder structure 120R formed below the $2^{nd}$ source/drain region 130R. This placeholder structures 120L and 120R may be formed of silicon germanium (SiGe), and may have been epitaxially grown from respective recesses formed in the substrate 101 prior to formation of the source/drain regions 130L and 130R. The placeholder structures 120L and 120R are termed as such these structural elements are formed only to provide spaces for backside contact structures, and removed and replaced by the backside contact structures, respectively, in a later step of manufacturing a semiconductor device from the intermediate semiconductor device 10. Here, the backside contact structures may refer to metal structures connecting the source/drain regions 130L and 130R to one or more voltage sources or other circuit elements through a backside of the semiconductor device.

In order for the backside contact structures to be formed, the substrate 101 may be first removed and replaced by a backside isolation structure formed of a dielectric material such as silicon oxide (e.g., $SiO_2$), and then, the placeholder structures 120L and 120R may be removed to provide recesses where the backside contact structure are to be formed in the backside isolation structure. The removal of the substrate 101 may be performed through, for example, wet etching using an etchant including, for example, a mixture of hydrogen peroxide ($H_2O_2$) and hydrofluoric acid (HF), not being limited thereto, that may selectively remove the substrate 101 of silicon (Si) against the placeholder structures 120L and 120R of the silicon germanium (SiGe).

However, because of a nanometer-scale process margin, a placeholder structure such as the $2^{nd}$ placeholder structure 120R may be undergrown from the substrate 101 such that a top surface of the $2^{nd}$ placeholder structure 120R is formed at a level below a top surface of the substrate 101. Consequently, the $2^{nd}$ source/drain region 130R may be overgrown from the channel layers 112 such that a bottom surface of the $2^{nd}$ source/drain region 130R is formed at a level below the top surface of the substrate 101, thereby the $2^{nd}$ source/drain region 130R contacting the substrate 101. However, in the event that the $2^{nd}$ placeholder structure 120R and the 2nd source/drain region 130R are formed in this manner, when the substrate 101 is removed to be replaced by the backside isolation structure, the wet etchant applied to remove the substrate 101 may also attack the $2^{nd}$ source/drain region 130R overgrown to contact the substrate 101 in a direction of arrows shown in FIG. 1B because the substrate 101 and the 2nd source/drain region 130R may both be formed of silicon (Si). Thus, an undesirable loss of the epitaxial structure of the 2nd source/drain region 130R may occur to deteriorate performance of the semiconductor device manufactured from the intermediate semiconductor device 10.

To address at least the foregoing problems of the 2nd placeholder structure 120R and other problems related to the intermediate semiconductor device 10 or the semiconductor device manufactured therefrom, one or more embodiments herebelow provide a method of manufacturing a semiconductor device including a backside contact structure formed based on a placeholder structure having a wide profile.

Figure 2A:
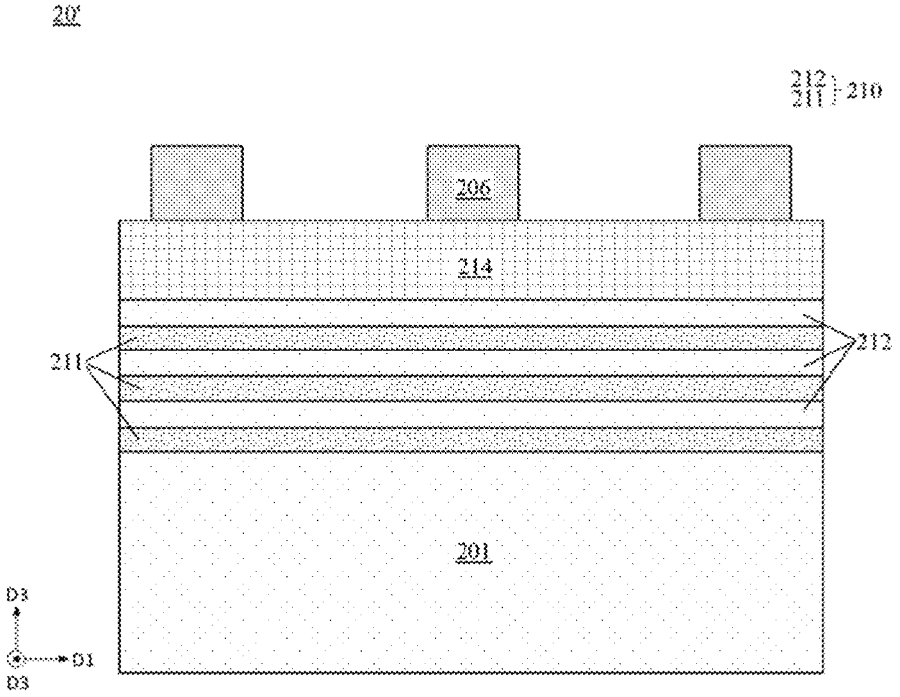
FIGS. 2A-2P illustrate intermediate semiconductor devices obtained after respective steps of manufacturing a semiconductor device including a backside contact structure formed based on a placeholder structure having a wide profile, according to one or more embodiments.
Figure 2B:
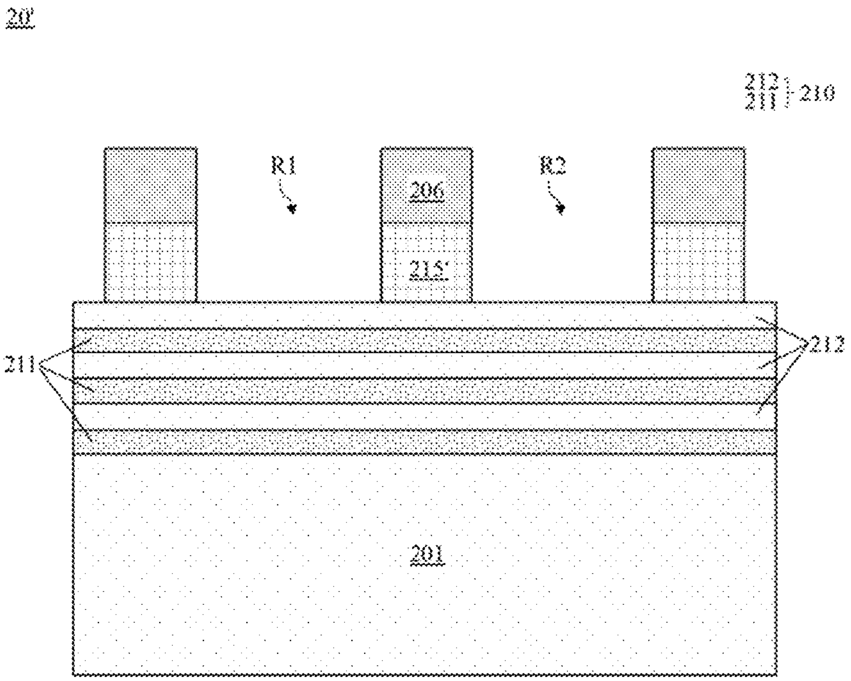
Figure 2C:
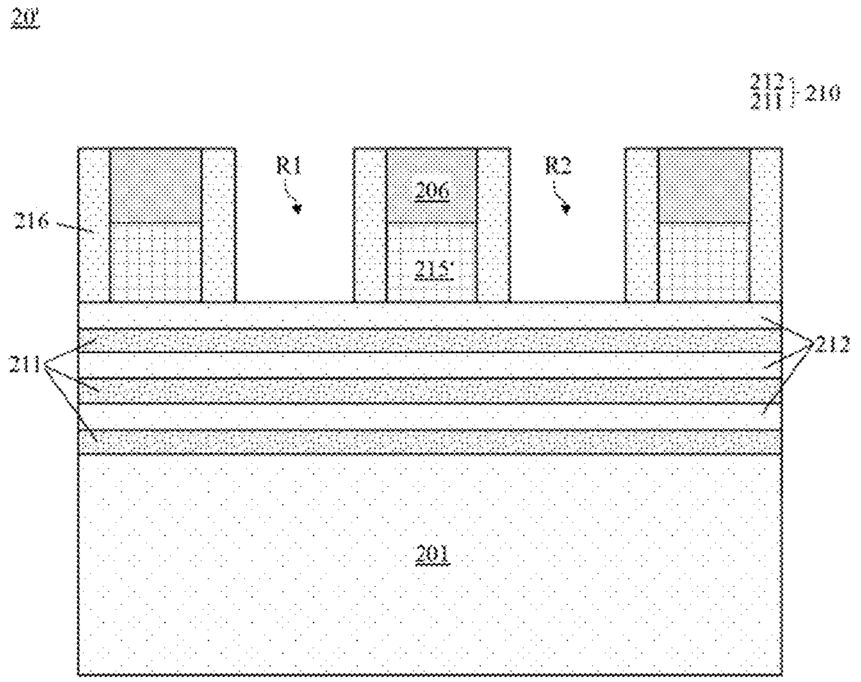
Figure 2D:
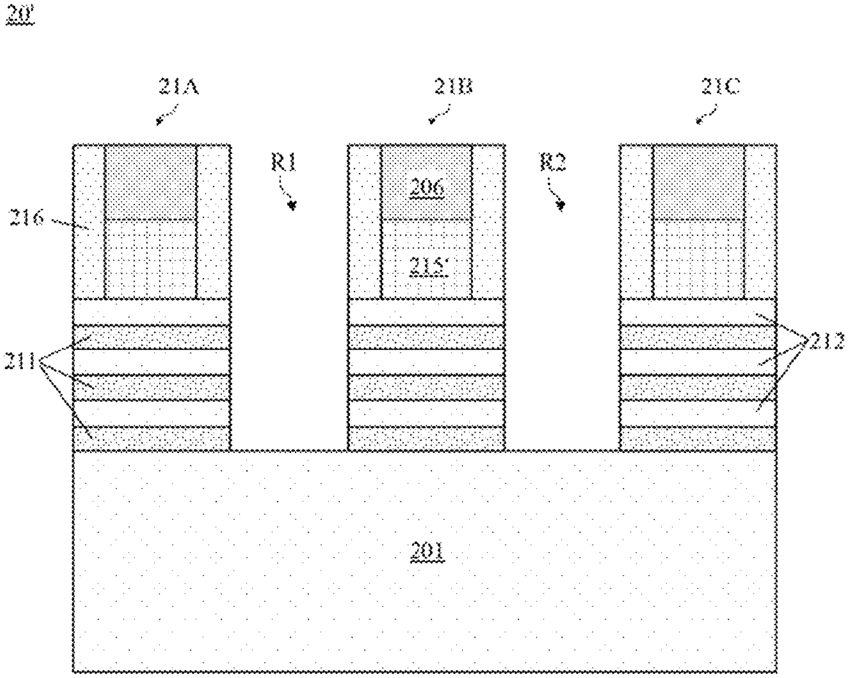
Figure 2E:
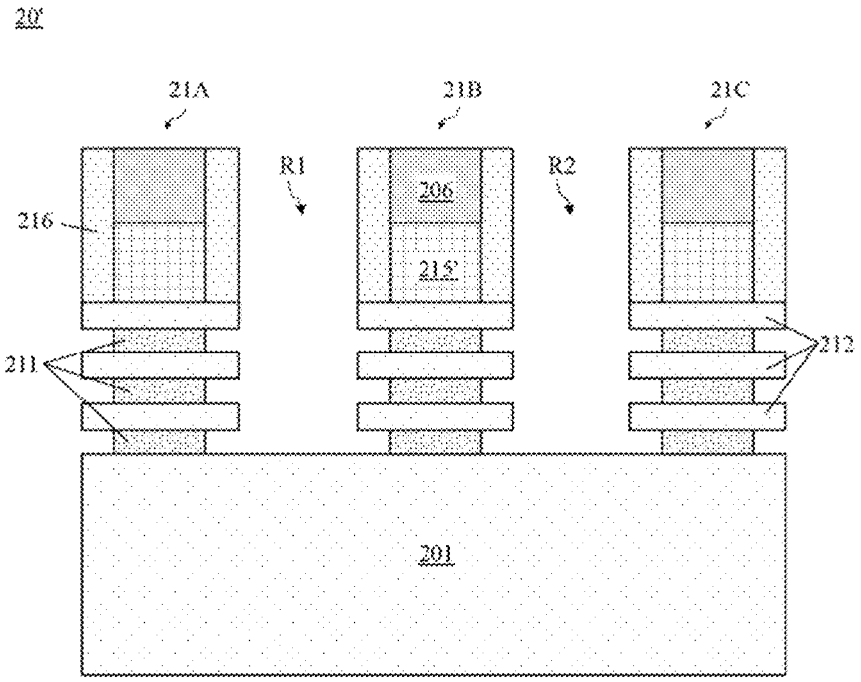
Figure 2F:
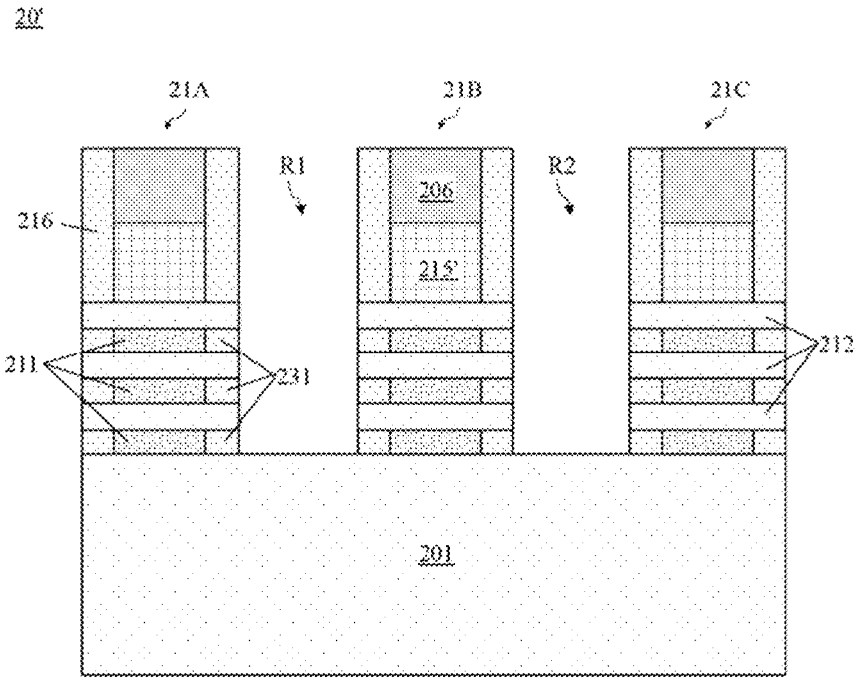
Figure 2G:
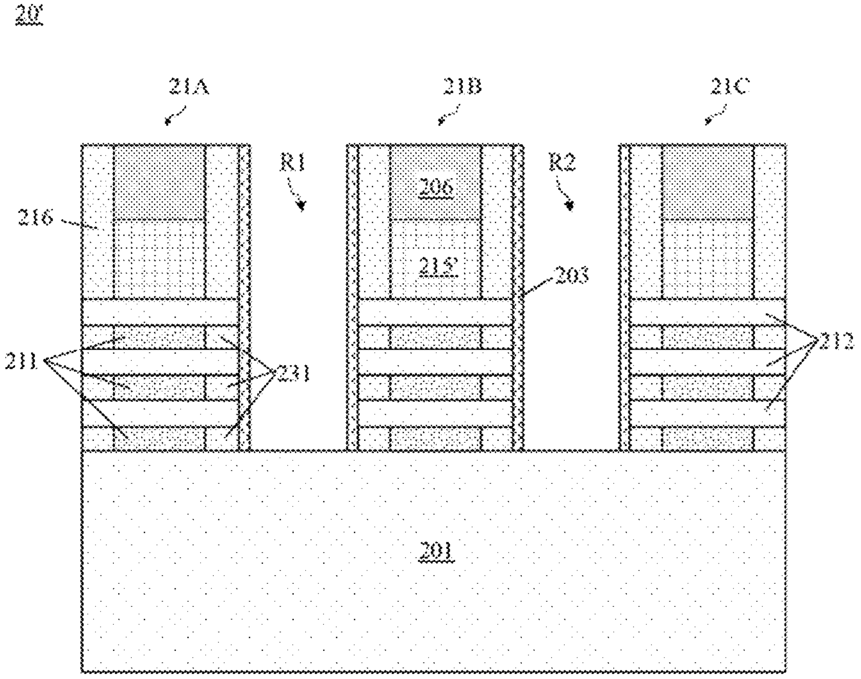
Figure 2H:
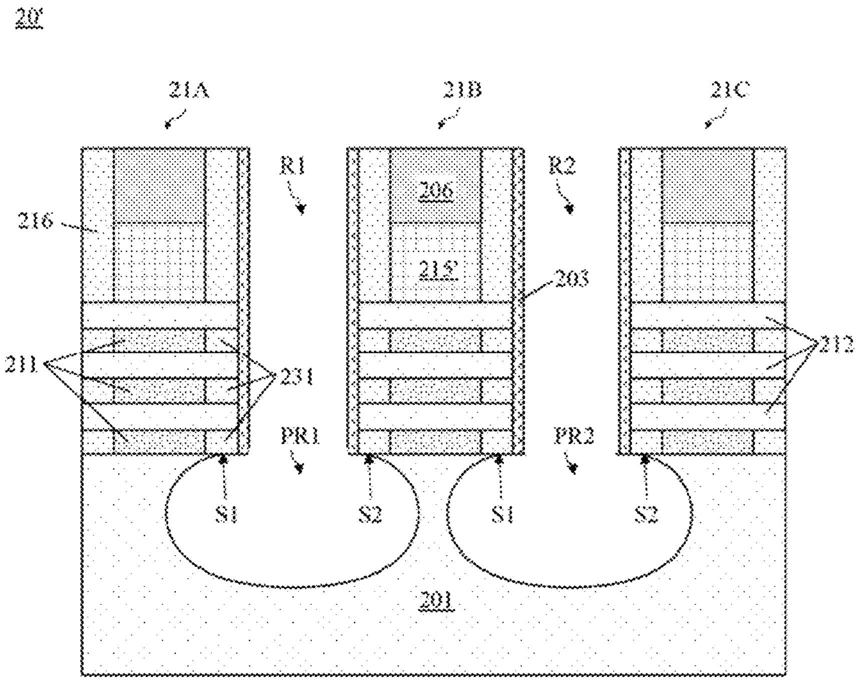
Figure 2I:
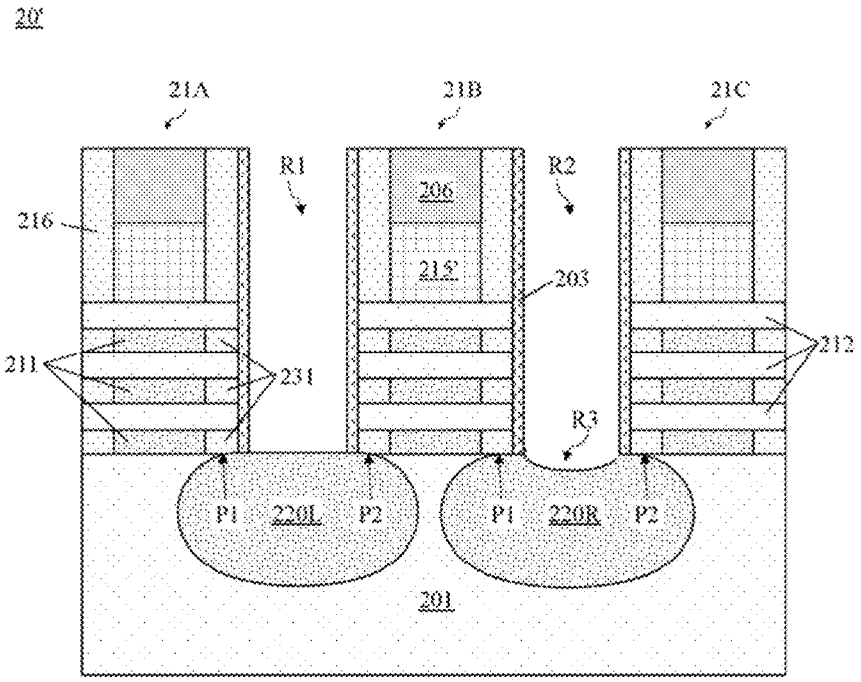
Figure 2J:
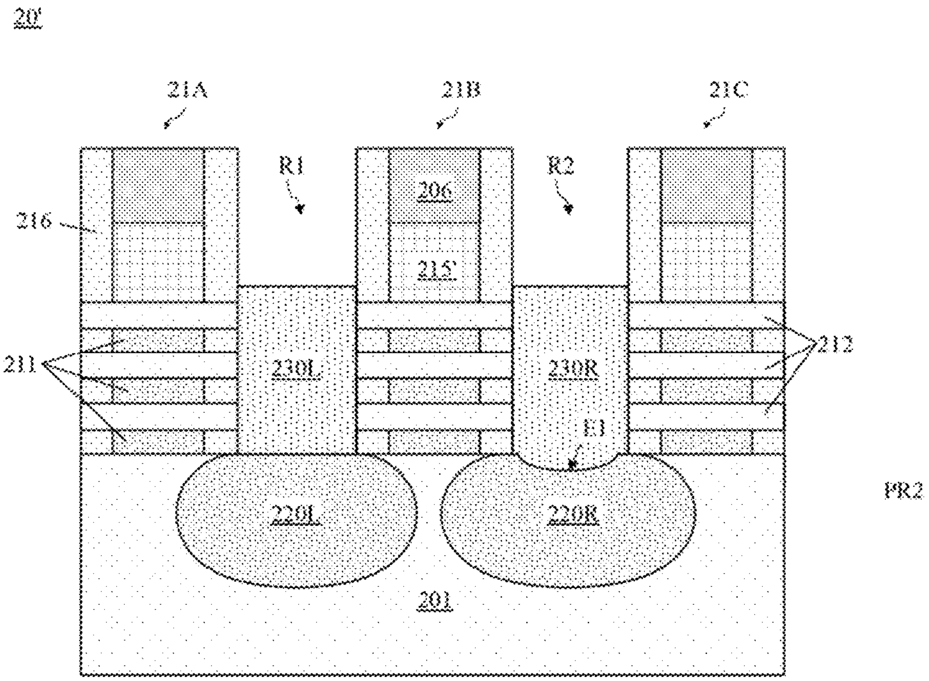
Figure 2K:
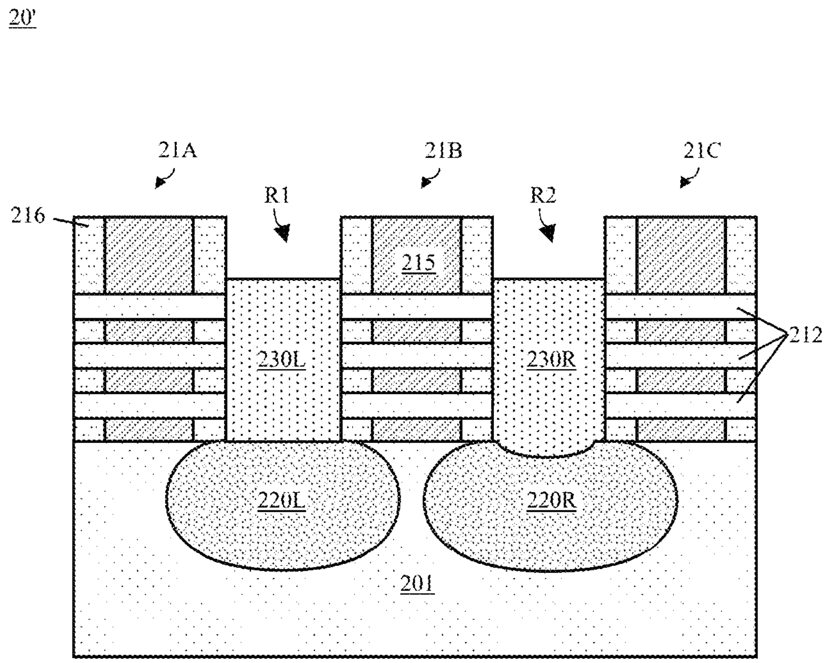
Figure 2L:
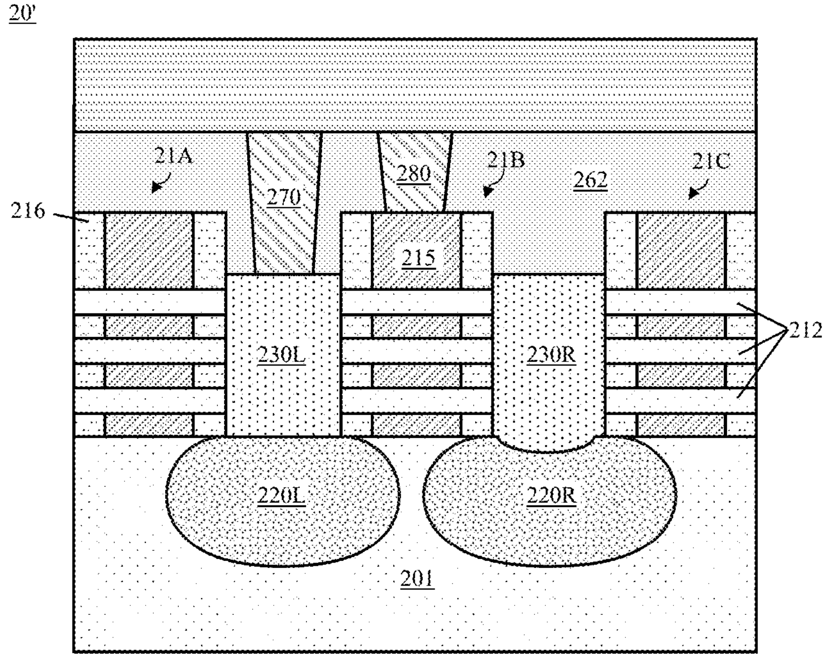
Figure 2M:
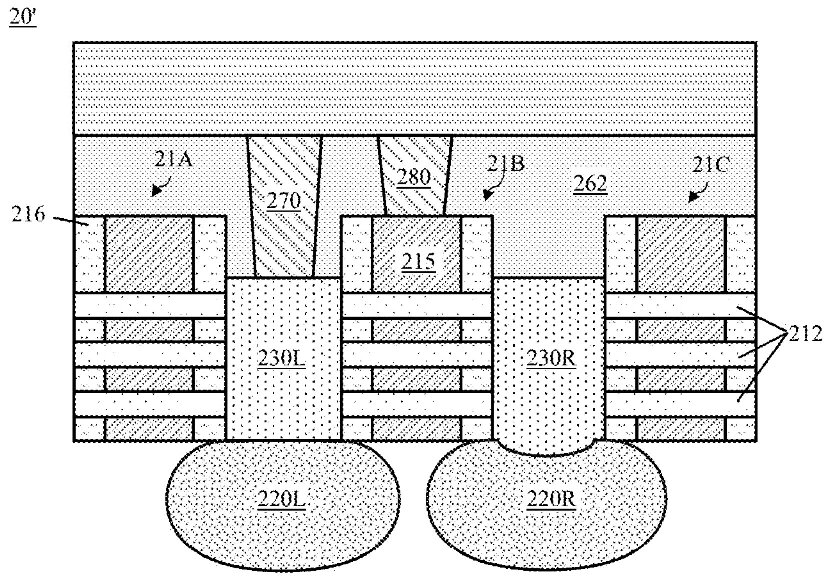
Figure 2N:
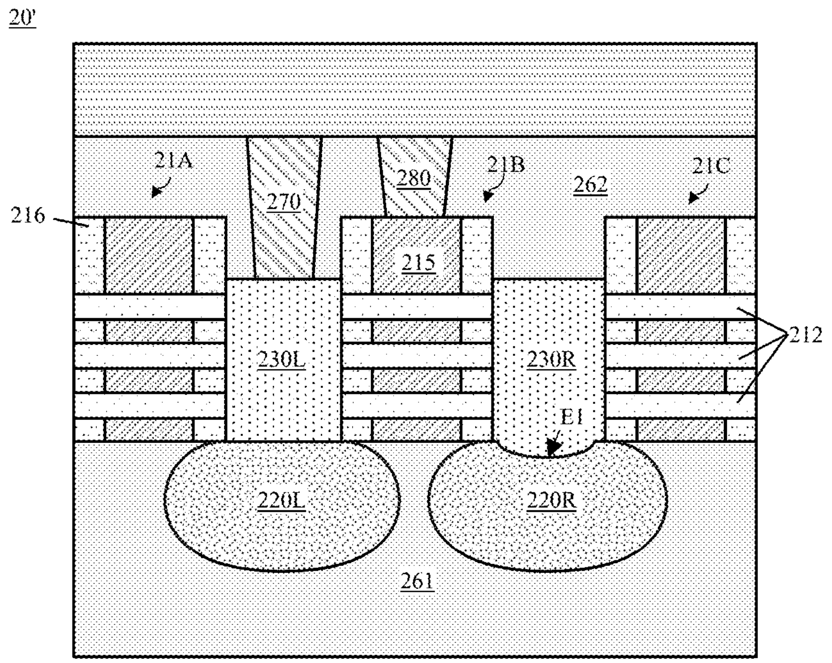
Figure 2O:
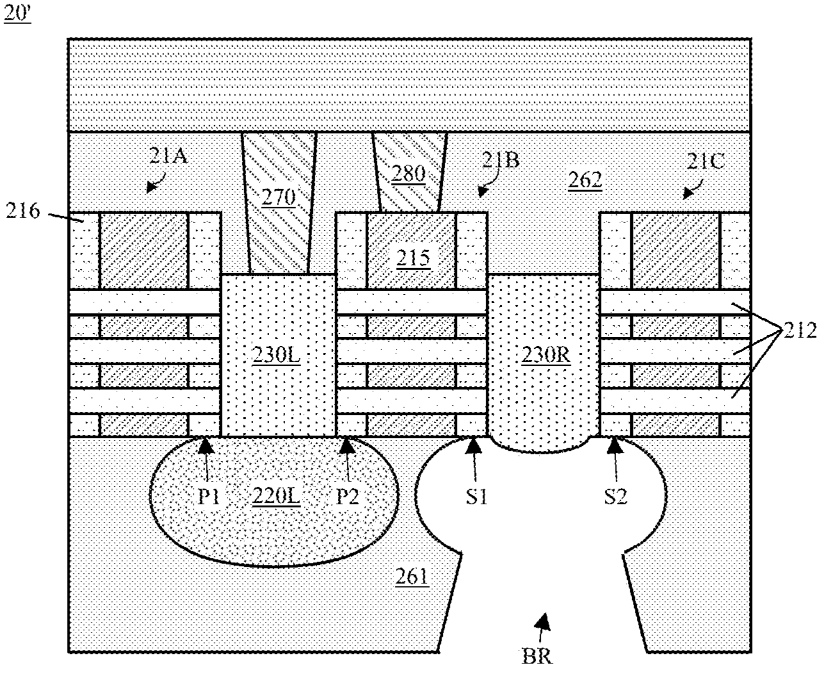
Figure 2P:
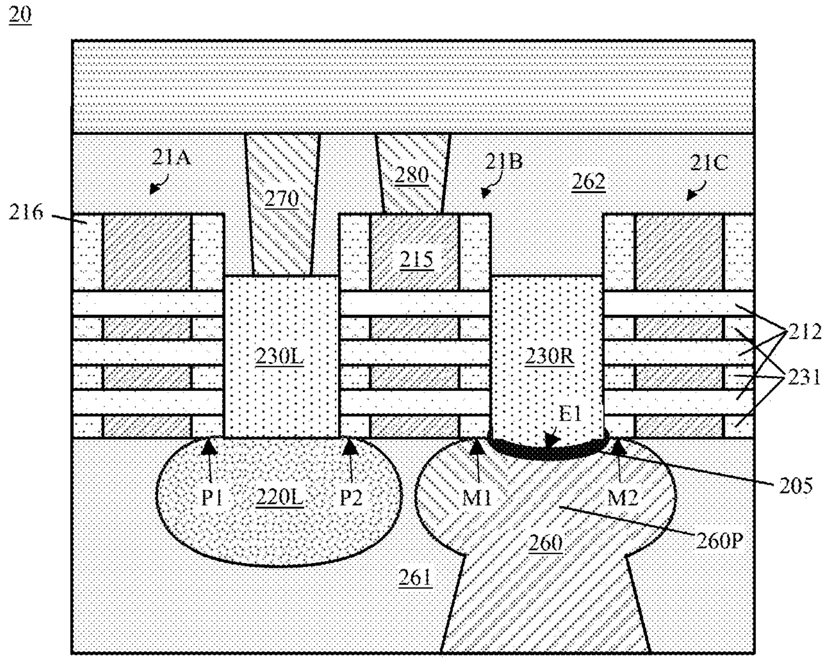

FIGS. 2A-2P illustrate intermediate semiconductor devices obtained after respective steps of manufacturing a semiconductor device including a backside contact structure formed based on a placeholder structure having a wide profile, according to one or more embodiments. As the semiconductor device manufactured through the respective steps of FIGS. 2A-2P may be the same as or correspond to a semiconductor device manufactured from the intermediate semiconductor device 10 shown in FIGS. 1A and 1B, duplicate descriptions thereof may be omitted herebelow.

Referring to FIG. 2A, an intermediate semiconductor device 20' may include a substrate 201 on which an initial channel stack 210, an initial dummy gate structure 214 and three hard mask patterns 206 are formed in this order.

The substrate 201 may be a silicon (Si) substrate which is the same as or similar to the substrate 101 of FIG. 1B. The initial channel stack 210 may include a plurality of sacrificial layers 211 and channel layers 212 epitaxially grown one after another to be stacked on the substrate 201. The sacrificial layers 211 may each be formed of silicon germanium (SiGe), and the channel layers 212 may include silicon (Si) or silicon germanium (SiGe). The sacrificial layers 211 are termed as such as these layers are formed therein to support formation of other structural elements of a semiconductor device to be manufactured from the intermediate semiconductor device 20' and will be removed and replaced by a gate structure in a later step (FIG. 2K) of manufacturing the semiconductor device.

The initial dummy gate structure 214 may be formed on the uppermost channel layer 212 and planarized through, for example, chemical mechanical polishing (CMP), not being limited thereto. The hard mask patterns 206 may be formed on the initial dummy gate structure 214 at positions where a plurality of dummy gate structures are to be patterned out therebelow in a next step (FIG. 2B). The initial dummy gate structure 214 may be formed of a material such as polycrystalline silicon or amorphous silicon, and the hard mask patterns 206 may be formed of a material such as silicon nitride or a composite thereof (e.g., SiN, $Si_3N_4$, SiBCN, SiNC, SiNOC, etc.).

Referring to FIG. 2B, the initial dummy gate structure 214 may be patterned to form three dummy gate structures 215' based on the hard mask patterns 206.

The formation of the three dummy gate structures 215' may be performed through, for example, dry etching such as reactive ion etching (RIE) based on the hard mask patterns 206. When the dummy gate structures 215' are formed based on the hard mask patterns 206, a top surface of the initial channel stack 210, for example, a top surface of the uppermost channel layer 212, may be exposed through a 1st recess R1 and a 2nd recess R2.

Referring to FIG. 2C, gate spacers 216 may be formed on side surfaces of each of the dummy gate structures 215' with the hard mask pattern 206 thereon.

The formation of the gate spacers 216 may be performed through, for example, atomic layer deposition (ALD), chemical vapor deposition (CVD), plasma enhanced CVD (PECVD), physical vapor deposition (PVD), or a combination thereof, not being limited thereto. To form the gate spacers 216, a material such as silicon nitride (e.g., SiN, $Si_3N_4$, etc.) or silicon oxide (e.g., $SiO_2$), not being limited thereto, may be deposited on the entire intermediate semiconductor device 20' obtained in the previous step (FIG. 2B), and etched back to leave the gate spacer material only on the side surfaces of each dummy gate structure 215' with the hard mask pattern 206 thereon.

Referring to FIG. 2D, the initial channel stack 210 may be etched back through the recesses R1 and R2 based on the hard mask patterns 206 and the gate spacers 216 to form 1st to 3rd channel stacks 21A-21C exposing a top surface of the substrate 201 therebetween.

By the etch back of the initial channel stack 210, the 1st recess R1 and the 2nd recess R2 may be extended down to expose the top surface of the substrate 201 and side surfaces of the channel layers 212 and the sacrificial layers 211, thereby forming three channel stacks 21A-21C divided by the recesses R1 and R2. The etch back operation in this step may be performed through, for example, dry etching, not being limited thereto.

Referring to FIG. 2E, side surfaces of each of the sacrificial layers 211 in each of the channel stacks 21A-21C may be recessed to provide spaces for forming inner spacers 231 therein in a next step (FIG. 2F).

The etching operation in this step may be performed through, for example, selective wet etching or dry etching, not being limited thereto, to remove only silicon germanium (SiGe) included in the sacrificial layers 211 against silicon (Si) included in the channel layers 212 and the substrate 201. For example, a mixture of nitric acid ($HNO_3$) and hydrofluoric acid (HF) may be used for the selective etching in this step.

Referring to FIG. 2F, inner spacers 231 may be formed at side surfaces of the recessed sacrificial layers 211.

Each of the inner spacer 231 may be formed such that side surfaces of the recessed sacrificial layer 211 exposed to the recesses R1 and R2 are vertically aligned with or coplanar with the side surfaces of the channel layers 212 and the gate spacers 216 also exposed to the recesses R1 and R2. The formation of the inner spacers 231 may be performed through, for example, atomic layer deposition (ALD) or any other suitable deposition process or electroplating.

The inner spacers 231 may be formed of a material such as silicon nitride (e.g., SiN, $Si_3N_4$) or silicon oxide (e.g., $SiO_2$), not being limited thereto, which may be the same as or different from that forming the gate spacers 216.

Referring to FIG. 2G, a protection liner 203 may be formed on the side surfaces of the gate spacers 216, the channel layers 212 and the inner spacers 231 exposed to the recesses R1 and R2.

The protection liner 203 may be formed through, for example, depositing a material such as silicon nitride or a composite thereof (e.g., SiN, SiBCN, SiOCN, SiOC, etc.) on the entire inner surfaces of the recesses R1 and R2 through, for example, atomic layer deposition (ALD) and partially removing the deposited material formed on the top surface of the substrate 201 exposed through the recesses R1 and R2. The partial removal of the protection liner 203 in this step may include, for examine, dry etching.

The formation and partial removal of the protection liner 203 in this step may be performed to protect the gate spacers 216, the channel layers 212 and the inner spacers 231 exposed to the recesses R1 and R2 from a subsequent operation of forming placeholder structures (FIGS. 2H and 2I).

Referring to FIG. 2H, the substrate 201 of which the top surface is exposed through recesses R1 and R2 may be patterned to extend the recesses R1 and R2 below a level of the top surface of the substrate 201.

In this step, the substrate 201 exposed through the 1st recess R1 and the 2nd recess R2 may be patterned through, for example, wet etching, not being limited thereto, based on the hard mask patterns 260, the gate spacers 216 and the protection liner 203 to form a 1st placeholder recess PR1 and a 2nd placeholder recess PR2 in the substrate 201 below the level of the top surface of the substrate 201. The top surface of the substrate 201 may be horizontally coplanar or aligned with a bottom surface of a bottom surface of the lowermost sacrificial layer 211 and a bottom surface of the lowermost inner spacer 231. The wet etching may be performed using an etchant such as potassium hydroxide (KOH), tetramethylammonium hydroxide (TMAH), etc. or a mixture thereof such that each of the placeholder recesses PR1 and PR2 can have a wide profile in the D1 direction. For example, an isotropic wet etching using the foregoing etchant may form the placeholder recesses PR1 and PR2 having an elliptical or circular shape in which a side edge of these placeholder recesses PR1 and PR2 may reach a position vertically below the sacrificial layers 211.

As will be described in a next step (FIG. 2I), the placeholder recesses R1 and R2 may be formed to have the wide profile so that placeholder structures to be filled therein may also have a wide profile to protect source/drain regions to be formed in the recesses R1 and R2 above the placeholder structures when the substrate 201 is removed in a later step (FIG. 2M).

The placeholder recesses PR1 and PR2 may be formed by the wet etching such that uppermost side edges S1 and S2 thereof are formed to contact bottom surfaces of the lowermost inner spacers 231 facing the recess R1 or R2. Thus, in the intermediate semiconductor device 20', the smallest width of each of the placeholder recesses PR1 and PR2 may be greater than a width of each of the recesses R1 and R2 in the D1 direction.

When a bottom diffusion isolation (BDI) layer (also referred to as bottom dielectric insulation layer) is formed on the bottom surfaces of the lowermost sacrificial layer 211 and the lowermost inner spacer 231, the uppermost side edges S1 and S2 may be formed to contact a portion of the bottom surface of the BDI layer vertically below the lowermost inner spacers 231 in the D3 direction. The BDI layer may be formed to prevent or reduce current leakage from a gate structure that is to replace the sacrificial layers 211 in a later step (FIG. 2K).

The placeholder recesses PR1 and PR2 may be connected to the recesses R1 and R2, respectively. In the recesses R1 and R2, source/drain regions will be formed, and placeholder structures will be formed in the placeholder recesses PR1 and PR2, in later steps.

Referring to FIG. 2I, a 1st placeholder structure 220L and a 2nd placeholder structure 220R may be respectively formed in the placeholder recesses PR1 and PR2 obtained in the previous step (FIG. 2H).

The placeholder structures 220L and 220R may be formed of, for example, silicon germanium (SiGe) which is epitaxially grown from the substrate 201 of silicon (Si) in the placeholder recesses PR1 and PR2. The placeholder structures 220L and 220R respectively formed in the placeholder recesses PR1 and PR2 may have the same outer profile as the placeholder recesses PR1 and PR2.

Thus, the placeholder structures 220L and 220R may be formed such that uppermost side edges P1 and P2 thereof respectively corresponding to the uppermost side edges S1 and S2 of the placeholder recesses PR1 and PR2 are formed to contact the bottom surfaces of the lowermost inner spacers 231 (or the bottom surface of the BDI layer below the lowermost inner spacers 231), and the smallest width of each of the placeholder structures 220L and 220R may also be greater than a width of each of the recesses R1 and R2.

However, at least one of the placeholder structures 220L and 220R may be formed to have a recess on a top surface thereof. For example, a recess may be formed on a top surface of the 2nd placeholder structure 220R to face the recess R2 thereabove in the D3 direction. Thus, the top surface of the 2nd placeholder structure 220R may have a concave shape. This recess R3 may be formed by controlling at least an epitaxy rate or temperature when the 2nd placeholder structure 220R is epitaxially grown from the substrate 201. Alternatively, the recess R3 may be formed when the 2nd placeholder structure 220R is unintentionally undergrown because of process variation. In contrast, the 1st placeholder structure 220L may be formed such that a top surface is relatively flat to be coplanar or substantially coplanar with the top surface of the substrate 201 as shown in FIG. 2I.

Due to the foregoing structural shape of the 2nd placeholder structure 220R, a source/drain region to be formed above the 2nd placeholder structure 220R may have a protrusion or a convex shape in a downward direction which is opposite to frontside structures of the intermediate semiconductor device 20', so that the source/drain region can have an increased footprint, thereby improving performance of a semiconductor device including this source/drain region.

It is to be understood here that although the recess R3 may have an elliptical concave shape as shown in FIG. 2I, the disclosure is not limited thereto. According to one or more other embodiments, the recess R3 may have a different shape, e.g., a rectangular shape.

Referring to FIG. 2J, the protection liner 203 may be removed to expose the channel layers 212 through the recesses R1 and R2, and 1st and 2nd source/drain regions 230L and 230R may be formed based on the channel layers 212.

The protection liner 203 formed at the side surfaces of the gate spacers 260, the channel layers 212 and the inner spacers 231 exposed in the recesses R1 and R2 may be removed though, for example, atomic layer etching (ALE). By removing the protection liner 203, the side surfaces of the gate spacers 260, the channel layers 212 and the inner spacers 231 exposed in the recesses R1 and R2 may be exposed again to the recesses R1 and R2.

Further, the source/drain regions 230L may be epitaxially grown from the channel layers 212 of the 1st channel stack 21A and the 2nd channel stack 21B in the 1st recess R1, and the 2nd source/drain region 230R may be epitaxially grown from the channel layers 212 of the 2nd channel stack 21B and the 3rd channel stack 21C in the 2nd recess R2, while the sacrificial layers 211 in each of the channel stacks 21A-21C are blocked by the inner spacers 231 to prevent or suppress epitaxy from the sacrificial layers 211 of silicon germanium (SiGe).

The source/drain regions 230L and 230R may be doped in-situ with p-type impurities or n-type impurities. Alternatively or additionally, the impurities may be injected into the source/drain regions 230L and 230R after the epitaxial growth thereof. After formation of the source/drain regions 230L and 230R, bottom surfaces of the source/drain regions 230L and 230R may contact the top surfaces of the placeholder structures 220L and 220R, respectively.

The 2$^{nd}$ source/drain region 230R may have a protrusion at a bottom surface thereof which fits in the recess R3 formed on the top surface of the 2$^{nd}$ placeholder structure 220R. Thus, a bottom edge E1 of the 2$^{nd}$ source/drain region 230R may be at a level below the top surface of the substrate 201. According to one or more other embodiments, the 1$^{st}$ source/drain region 230L may have the same protrusion as the 2$^{nd}$ source/drain region 230R when the 1$^{st}$ placeholder structure 220L has the same recess as the recess R3 of the 2$^{nd}$ placeholder structure 220R.

Additionally, a silicon buffer layer may be optionally formed on the top surfaces of the placeholder structures 220L and 220R to protect the source/drain regions 230L and 230R when the placeholder structures 220L and 220R are removed by an etching operation (e.g. wet etching) and replaced by respective backside contact structures in a later step (e.g., FIG. 2O). The silicon buffer layer may be formed prior to the removal of the protection liner 203 to passivate the placeholder structures 220L and 220R during the removal of the protection liner 203.

Referring to FIG. 2K, the hard mask patterns 206 may be removed, and the dummy gate structure 215' and the sacrificial layers 211 may be removed and replaced by gate structures 215.

After formation of the source/drain regions 230L and 230R, the hard mask patterns 206 on the dummy gate structures 215' and portions of the gate spacers 216 at side surfaces of the hard mask patterns 206 may be removed by, for example, dry etching including stripping or ashing, not being limited thereto.

The dummy gate structure 215' and the sacrificial layers 211 may be removed through, for example, wet etching and/or dry etching, to form voids or spaces in each of the channel stacks 21A-21C, and gate structures 215 may be formed in these voids or spaces through, for example, chemical vapor deposition (CVD), plasma enhanced CVD (PECVD), physical vapor deposition (PVD), atomic layer deposition (ALD), or a combination thereof, not being limited thereto.

Referring to FIG. 2L, a frontside isolation structure 262, a middle-of-line (MOL) structure including a frontside contact structure 270 and a gate contact structure 280, and a back-end-of-line (BEOL) structure 290 including one or more metal lines and/or vias may be formed on the intermediate semiconductor device 20' obtained in the previous step (FIG. 2K).

The frontside isolation structure 262 may be formed on the intermediate semiconductor device 20' obtained in the previous step (FIG. 2K) including the source/drain regions 230L and 230R to isolate the source/drain regions 230L and 230R from each other and other circuit elements. The frontside isolation structure 262 may include silicon oxide (e.g., $SiO_2$, etc.). The formation of the frontside isolation structure 262 may be performed through, for example, PVD, CVD, PECVD, a combination thereof, followed by planarization such as chemical-mechanical polishing (CMP), not being limited thereto.

Subsequently, the frontside contact structure 270 and the gate contact structure 280 may be formed on top surfaces of the 1$^{st}$ source/drain region 230L and the gate structure 215, respectively, through the frontside isolation structure 262. The frontside contact structure 270 may connect the 1$^{st}$ source/drain region 230L to a voltage source or another circuit element. The gate contact structure 280 may receive a gate input signal for the gate structure 215. Here, a frontside contact structure may not be formed on a top surface of the 2$^{nd}$ source/drain region 230R because a backside contact structure instead of the frontside contact structure may be formed in a later step (FIG. 2P) to connect the 2$^{nd}$ source/drain region 230R to a voltage source or another circuit element.

In addition, the BEOL structure 290 may be formed on the frontside isolation structure 262 to connect the frontside contact structure 270 and the gate contact structure 280 to a voltage source or other circuit elements through one or more metal lines and/or vias formed therein. The formation of the BEOL structure 290 may include one or more damascene processes. The contact structures 270 and 280 of the MOL structure and the metal lines and vias included in the BEOL structure 290 may include one or more metal materials such as copper (Cu), aluminum (Al), tungsten (W), molybdenum (Mo), ruthenium (Ru), etc., not being limited thereto.

Referring to FIG. 2M, the substrate 201 may be removed, for example, in its entirety, from a back side of the intermediate semiconductor device 20' obtained in the previous step (FIG. 2L) exposing the placeholder structures 220L and 220R in the back side of the intermediate semiconductor device 20'.

The substrate removal operation in this step may be performed through, for example, wet etching using an etchant, for example, a mixture of hydrogen peroxide ($H_2O_2$) and hydrofluoric acid (HF), not being limited thereto, that may selectively remove the substrate 201 of silicon (Si) against the placeholder structures 220L and 220R of the silicon germanium (SiGe). This substrate removal operation and subsequent operations may be performed by flipping upside down the intermediate semiconductor device 20' obtained in the previous step (FIG. 2L).

At this time, due to the wide profile of the placeholder structures 220L and 220R, the wet etchant may not attack the 2$^{nd}$ source/drain region 230R of which a bottom surface is at a level below the top surface of substrate 201, which is now removed. Thus, the wide placeholder structure 220R may prevent the wet etchant from infiltrating into the 2$^{nd}$ source/drain region 230R to cause loss of epitaxial structure of the 2$^{nd}$ source/drain region that may occur to the intermediate semiconductor device 10 shown in FIG. 1B.

Referring to FIG. 2N, a backside isolation structure 261 may be formed in a space provided by the removal of the substrate 202 in the previous step (FIG. 2M).

The backside isolation structure 261 may be formed through, for example, depositing a dielectric material such as silicon oxide (e.g., $SiO_2$) using CVD, PVD, PECVD, etc. followed by planarization, not being limited thereto, to isolate backside contact structures to be formed in the spaces currently occupied by the placeholder structures 220L and 220R from each other or other circuit elements.

As the backside isolation structure 261 replaces the substrate 201, the bottom edge E1 of the 2nd source/drain region 230R may be at a level below a top surface of the backside isolation structure 261.

Referring to FIG. 2O, a backside recess BR may be formed by removing a portion of the backside isolation structure 261 and the 2$^{nd}$ placeholder structure 220R thereabove in the backside isolation structure 261.

The formation of the backside recess BR may be performed through, for example, dry etching, wet etching, or a combination thereof, on a portion of the backside isolation structure 261 and the 2$^{nd}$ placeholder structure 220R thereabove to expose a bottom surface of the 2$^{nd}$ source/drain region 230R, which may be protruded downward in a direction opposite to the frontside structure of the intermediate semiconductor device 20' including the channel layers 212, the gate structures 215, the frontside contact structures 270 and 280.

When the 2nd placeholder structure 220R is removed, the 2nd placeholder recess PR2 including the uppermost side edges S1 and S2 may be reopen.

While the 2nd placeholder structure 220R is removed, the 1st placeholder structure 220L may remain in the backside isolation structure as shown in FIG. 2O. Alternatively, another backside recess may be formed by removing a portion of the backside isolation structure 261 and the 1st placeholder structure 220L thereabove, and this backside recess may be filled in with a supplemental backside isolation structure formed of the same dielectric material such as silicon oxide (e.g., $SiO_2$) forming the backside isolation structure 261.

Referring to FIG. 2P, a backside contact structure 260 may be formed in the backside recess to be connected to the bottom surface of the 2nd source/drain region 230R.

Prior to the formation of the backside contact structure 260, a silicide layer 205 may be formed on the bottom surface of the 2nd source/drain region 230R. The silicide layer 205 may facilitate an interface for current flow between the 2nd source/drain region 230R formed of a semiconductor material (e.g., Si or SiGe) and the backside contact structure 260 by reducing contact resistance therebetween. The silicide layer 205 may also improve adhesion of the backside contact structure 250 to the 2nd source/drain region 230R.

The silicide layer 205 may be formed by depositing a thin metal layer such as titanium (Ti), cobalt (Co), and/or nickel (Ni), not being limited thereto, on the bottom surface of the 2nd source/drain region 230R and annealing the thin metal layer, thereby to form a silicide layer including nickel silicide (NiSi), cobalt silicide (CoSi), titanium silicide ($TiSi_2$), or so on.

The backside contact structure 260 may be formed through, for example, depositing one or more metal materials such as copper (Cu), aluminum (Al), tungsten (W), molybdenum (Mo), ruthenium (Ru), etc. using PVD, CVD, PECVD, or a combination thereof, not being limited thereto. Additionally, one or more backside metal lines may be formed below the backside contact structure 260 to be connected to the 2nd source/drain region 230R through the backside contact structure 260.

The backside contact structure 260 may have a placeholder portion 260P and a remaining portion therebelow. The placeholder portion 260P of the backside contact structure 260 may be a portion replacing the 2nd placeholder structure 220R, and thus, may have a wide profile to increase a contact area with respect to the 2nd source/drain region 230R, thereby reducing contact resistance. For example, uppermost side edges M1 and M2 of the placeholder portion 260P may contact the bottom surfaces of the lowermost inner spacers 231 (or the bottom surface of the BDI layer vertically below the lower most inner spacers 231) facing the 2nd source/drain regions 230R. Thus, the smallest width of the backside contact structure 260, which is between the uppermost side edges M1 and M2 may be greater than a width of the 2nd source/drain region 230R in the D1 direction. Further, as the 2nd source/drain region 230R has a protrusion on the bottom surface thereof, The placeholder portion 260P and the remaining portion of the backside contact structure 260 may be a single continuum metal structure without any interface or connection surface therebetween.

Through the above steps, a semiconductor device 20 including a backside contact structure having a wide profile may be manufactured.

In the meantime, as described above, the wide-profile placeholder structures 220L and 220R are formed in the substrate 201 of silicon (Si) (FIGS. 2H and 2I) to prevent the wet etchant from intruding upon the source/drain regions 230L and 230R also formed of silicon (Si) when the substrate 201 is removed by the wet etchant (FIG. 2M). However, in an example case in which each of these source/drain regions is formed of silicon germanium (SiGe) to form a p-type source/drain region, placeholder structures may not need to be formed to have the wide profile like the placeholder structures 220L and 220R. This is because the wet etchant selectively removing the Si substrate 201 against the SiGe placeholder structures 220L and 220R may not attack the SiGe source/drain regions. Thus, a semiconductor device including the p-type nanosheet transistor may have a backside contact structure and a placeholder structure different from the semiconductor device 20 shown in FIG. 2P.

Figure 3:
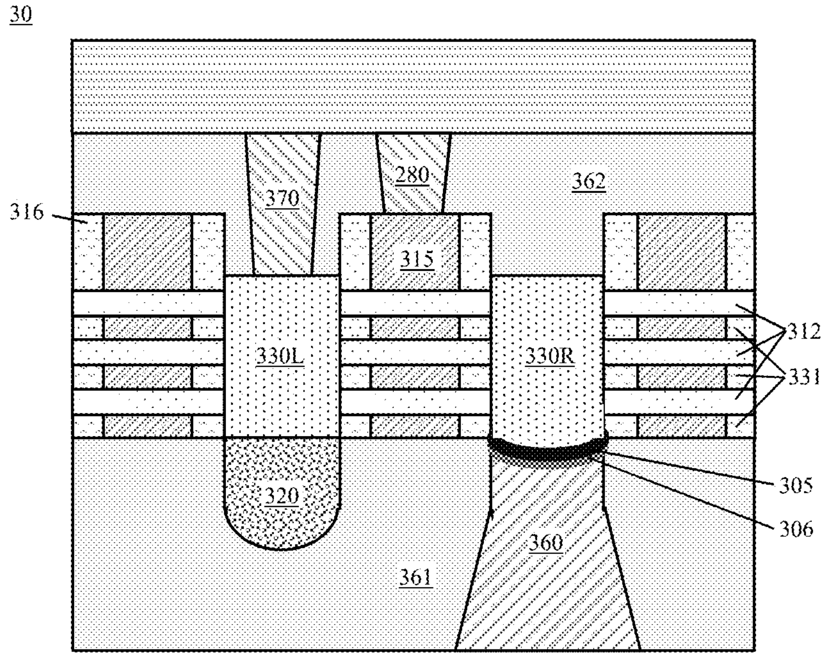
FIG. 3 illustrates a semiconductor device including a backside contact structure and a placeholder structure, according to one or more embodiments.

FIG. 3 illustrates a semiconductor device including a backside contact structure and a placeholder structure, according to one or more embodiments.

Referring to FIG. 3, a semiconductor device 30 may include a p-type nanosheet transistor including a placeholder structure 320 and a backside contact structure 360. The semiconductor device 30 may also have the same structural elements forming the semiconductor device 20 of FIG. 2P such as source/drain regions 330L and 330R, a silicide layer 305, channel layers 312, gate structures 315, inner spacers 331, gate spacers 316, isolation structures 361 and 362, and frontside contact structures 370 and 380. Duplicate descriptions thereof may be omitted herein. However, the semiconductor device 30 may be different from the semiconductor device 20 of FIG. 2P at least by the materials forming the source/drain regions 330L and 330R and the structural shapes and profiles of the placeholder structure 320 and the backside contact structure 360.

In the semiconductor device 30, the source/drain regions 330L and 330R may be formed of silicon germanium (SiGe) doped with p-type impurities such as boron (B), gallium (Ga), indium (In), etc., the placeholder structure 320 and the backside contact structure 360 may have a narrow profile compared to the 1st placeholder structure 220L and the backside contact structure 260 of the semiconductor device 20 of FIG. 2P. For example, a width the placeholder structure 320 may be smaller than the smallest width of the 1st placeholder structure 220L of the semiconductor device 20, and a width of an upper portion of the backside contact structure 360 may be smaller than the smallest width of the backside contact structure 260 of the semiconductor device 20.

This structural difference may be obtained because there is no or less concern of a wet etchant removing the source/drain regions 330L and 330R when a substrate of silicon (Si) is removed to be replaced by the backside isolation structure 361 as described above. For example, even when the placeholder structure 320 is undergrown like the 2nd placeholder structure 120R and the 2nd source/drain region 330R is protruded inside a substrate like the 2nd source/drain region 130R as shown in FIG. 1B, the wet etchant removing the substrate of silicon (Si) may not attack the 1st source/drain region 330L or may not attack as much as the wet etchant can do the 2nd source/drain region 130R.

Further, when the source/drain regions 330L and 330R are of p-type including silicon germanium (SiGe), a silicon capping layer 306 may be formed on a top surface of at least a placeholder structure replaced by the backside contact structure 360. The silicon capping layer may protect the 2nd source/drain region 330R of silicon germanium (SiGe) from being etched by dry etching or wet etching using an etchant removing the placeholder structure of the same silicon germanium (SiGe).

Thus, a semiconductor device including a plurality of field-effect transistors may be formed such that a placeholder structure and a backside contact structure have different profiles by the polarity type of a source/drain region connected to the placeholder structure or the backside contact structure. For example, a semiconductor device may include both the semiconductor device 20 of FIG. 2P and the semiconductor device 30 of FIG. 3 on a single backside isolation structure.

FIG. 4 illustrates a flowchart describing a method of manufacturing a semiconductor device including a backside contact structure formed based on a placeholder structure having a wide profile in reference to FIGS. 2A-2P, according to one or more embodiments.

In step S10, a placeholder recess having a wide profile may be formed in a silicon (Si) substrate of an intermediate semiconductor device including one or more channel stacks (FIGS. 2A-2H). The placeholder recess may be formed through, for example, wet etching such that the smallest width of the placeholder recess between uppermost side edges of the placeholder recess in the substrate is greater than a recess thereabove where a source/drain region is to be formed from the channel stacks.

In step S20, a placeholder structure may be formed in the placeholder recess to have the same wide profile as the placeholder recess (FIG. 2I). The placeholder structure may be formed of a material such as silicon germanium (SiGe).

In step S30, a silicon (Si) source/drain region may be formed in a recess between the channel stacks, above the placeholder recess, and a dummy gate structure and sacrificial layers in the channel stacks may be removed and replaced by a gate structure so that the gate structure surrounds channel layers of the channel stacks (FIGS. 2J-2L)

In step S40, the Si substrate may be removed and replaced by a backside isolation structure, and the placeholder structure may be removed from the backside isolation structure (FIGS. 2M-2O). When the silicon (Si) substrate is removed, the etchant may not intrude into the Si source/drain region formed above the SiGe placeholder structure having a wide profile due to the etch selectivity between Si and SiGe.

In step S50, a backside contact structure may be formed in a backside recess provided by the removal of the placeholder structure in the backside isolation structure (FIG. 2P). As the backside contact structure fills in the backside recess where the placeholder structure having a wide profile is formed and removed, the backside contact structure may also have a wide profile, to provide an improved connection performance.

In the above embodiments, the semiconductor devices 20 and 30 shown in FIGS. 2P and 3, respectively, are a nanosheet transistor structure. However, the above embodiments may also apply to a different type of field-effect transistor such as FinFET, a forksheet transistor, a three-dimensional (3D) stacked semiconductor device including any one of a FinFET, a nanosheet transistor and a forksheet transistor in each stack.

Figure 5:
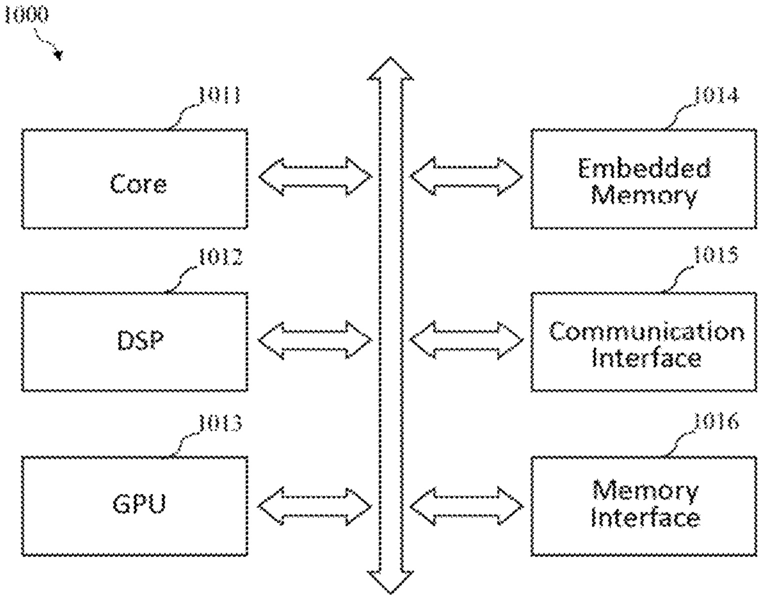
FIG. 5 is a schematic block diagram illustrating an electronic device including a semiconductor device including a backside contact structure formed based on a placeholder structure having a wide profile, according to one or more embodiments.

FIG. 5 is a schematic block diagram illustrating an electronic device including a semiconductor device including a backside contact structure formed based on a placeholder structure having a wide profile, according to one or more embodiments. This semiconductor device may be or correspond to the semiconductor device 20 shown in FIG. 2P.

Referring to FIG. 5, an SoC 1000 may be an integrated circuit in which components of a computing system or other electronic systems are integrated. As an example of the SoC 1000, an application processor (AP) may include at least one processor and components for various functions. The SoC 1000 may include a core 1011 (e.g., a processor), a digital signal processor (DSP) 1012, a graphic processing unit (GPU) 1013, an embedded memory 1014, a communication interface 1015, and a memory interface 1016. The components of the SoC 1000 may communicate with each other through a bus 1007.

The core 1011 may process instructions and control operations of the components included in the SoC 1000. For example, the core 1011 may process a series of instructions to run an operating system and execute applications on the operating system. The DSP 1012 may generate useful data by processing digital signals (e.g., a digital signal provided from the communication interface 1015). The GPU 1013 may generate data for an image output by a display device from image data provided from the embedded memory 1014 or the memory interface 1016, or may encode the image data.

The embedded memory 1014 may store data necessary for the core 1011, the DSP 1012, and the GPU 1013 to operate. The communication interface 1015 may provide an interface for a communication network or one-to-one communication. The memory interface 1016 may provide an interface for an external memory of the SoC 1000, such as a dynamic random access memory (RAM) (DRAM), a flash memory, etc.

At least one of the core 1011, the DSP 1012, the GPU 1013, and/or the embedded memory 1014 may include the semiconductor device 20 shown in FIG. 2.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A semiconductor device comprising:

a 1st source/drain region; and a backside contact structure on a bottom surface of the 1st source/drain region, wherein the backside contact structure comprises a conductive material, wherein a width of an upper portion of the backside contact structure is greater than a width of the 1st source/drain region in a channel-length direction, wherein a top surface of the backside contact structure facing the bottom surface of the 1st source/drain region comprises a concave shape, and wherein the semiconductor device further comprises a silicon capping layer on the top surface of the backside contact structure and a silicide layer between the silicon capping layer and the bottom surface of the 1st source/drain region.

2. The semiconductor device of claim 1, further comprising:

a gate structure; and an inner spacer between the gate structure and the 1$^{st}$ source/drain region, wherein an uppermost side edge of the backside contact structure is below a bottom surface of the inner spacer in a vertical direction intersecting the channel-length direction.

3. The semiconductor device of claim 1, wherein the bottom surface of the 1$^{st}$ source/drain region is protruded toward the backside contact structure.

4. The semiconductor device of claim 1, further comprising a gate structure, wherein a side edge of the backside contact structure is below the gate structure in a vertical direction intersecting the channel-length direction.

5. The semiconductor device of claim 1, wherein the 1$^{st}$ source/drain region is of n-type.

6. The semiconductor device of claim 1, further comprising:

a 2$^{nd}$ source/drain region;

a channel structure connecting the 1$^{st}$ source/drain region and the 2$^{nd}$ source/drain region; and a placeholder structure on a bottom surface of the 2$^{nd}$ source/drain region, wherein a width of an upper portion of the placeholder structure is greater than a width of the 2$^{nd}$ source/drain region in the channel-length direction.

7. The semiconductor device of claim 6, wherein the 1$^{st}$ source/drain region and the 2$^{nd}$ source/drain region are of n-type.

8. The semiconductor device of claim 6, wherein the 1$^{st}$ source/drain region, the 2$^{nd}$ source/drain region, and the placeholder structure comprise silicon germanium (SiGe).

9. The semiconductor device of claim 6, further comprising:

a gate structure; and an inner spacer between the gate structure and the 2$^{nd}$ source/drain region, wherein an uppermost side edge of the placeholder structure is below a bottom surface of the inner spacer in a vertical direction intersecting the channel-length direction.

10. A semiconductor device comprising a 1$^{st}$ transistor and a 2$^{nd}$ transistor, wherein the 1$^{st}$ transistor comprises:

a 1$^{st}$ source/drain region; and a 1$^{st}$ backside contact structure on a bottom surface of the 1$^{st}$ source/drain region, wherein the 2$^{nd}$ transistor comprises:

a 2$^{nd}$ source/drain region; and a 2$^{nd}$ backside contact structure on a bottom surface of the 2$^{nd}$ source/drain region, wherein an upper portion of the 2$^{nd}$ backside contact structure has a smaller width than an upper portion of the 1$^{st}$ backside contact structure, wherein the 2$^{nd}$ transistor further comprises a silicon capping layer on a top surface of the 2$^{nd}$ backside contact structure and a silicide layer between the silicon capping layer and the bottom surface of the 2$^{nd}$ source/drain region, wherein the silicon capping layer is between the 1$^{st}$ backside contact structure and the 1$^{st}$ source/drain region, wherein the 1$^{st}$ backside contact structure has a greater width than the 1$^{st}$ source/drain region, and wherein the 2$^{nd}$ backside contact structure does not have a greater width than the 2$^{nd}$ source/drain region.

11. The semiconductor device of claim 10, wherein the 1$^{st}$ source/drain region is of n-type, and the 2$^{nd}$ source/drain region is of p-type.

12. The semiconductor device of claim 10, wherein the 1$^{st}$ transistor further comprises a 3$^{rd}$ source/drain region and a 3$^{rd}$ placeholder structure on a bottom surface of the 3$^{rd}$ source/drain region, and wherein a width of an upper portion of the 3$^{rd}$ placeholder structure is greater than a width of the 3$^{rd}$ source/drain region in a channel-length direction.

13. The semiconductor device of claim 12, wherein the 2$^{nd}$ transistor comprises a 4th source/drain region and a 4th placeholder structure on a bottom surface of the 4th source/drain region, and wherein a width of an upper portion of the 4th placeholder structure is smaller than the width of the upper portion of the 3$^{rd}$ placeholder structure.

14. The semiconductor device of claim 10, further comprising a backside isolation structure surrounding the 1$^{st}$ backside contact structure and the 2$^{nd}$ backside contact structure.

15. The semiconductor device of claim 1, further comprising a backside isolation structure surrounding the backside contact structure, wherein a bottom edge of the 1$^{st}$ source/drain region is below a top surface of the backside isolation structure.

16. The semiconductor device of claim 10, wherein the silicon capping layer is not on a top surface of the 1$^{st}$ backside contact structure.

17. The semiconductor device of claim 10, wherein the 2$^{nd}$ source/drain region is on an opposite side of the 2$^{nd}$ backside contact structure with respect to a substrate of the semiconductor device.

18. The semiconductor device of claim 10, wherein a top surface of the silicide layer is in contact with the bottom surface of the 1$^{st}$ source/drain region, and the top surface of the silicide layer comprises a concave shape facing the 1$^{st}$ source/drain region.

* * * * *